United States Patent [19]

Lien

[11] Patent Number: 5,502,892
[45] Date of Patent: Apr. 2, 1996

[54] METHOD OF FORMING A WELDED ENCASEMENT FOR A COMPUTER CARD

[75] Inventor: Teh-Sou Lien, Taipei, Taiwan

[73] Assignee: Maxconn Incorporated, San Jose, Calif.

[21] Appl. No.: 270,005

[22] Filed: Jul. 1, 1994

[51] Int. Cl.$^6$ .............................. H05K 5/04; H01L 21/58
[52] U.S. Cl. .................. 29/841; 29/DIG. 29; 174/52.1; 257/679; 361/684; 361/737; 439/76.1
[58] Field of Search .................... 29/841, 883, DIG. 29, 29/DIG. 3; 174/35 R, 52.1–52.3; 257/679; 156/73.1; 361/728, 736, 737, 745, 684; 439/76, 377; 228/110.1, 903

[56] References Cited

U.S. PATENT DOCUMENTS

| | | | |
|---|---|---|---|
| 3,775,643 | 11/1973 | Schachnow et al. | 439/377 |
| 4,887,188 | 12/1989 | Yoshida et al. | 361/684 X |
| 5,061,845 | 10/1991 | Pinnavaia | 361/736 X |
| 5,107,404 | 4/1992 | Tam | 361/736 X |
| 5,149,276 | 9/1992 | Dixon | 439/159 |
| 5,176,523 | 1/1993 | Lai | 439/377 X |
| 5,207,586 | 5/1993 | MacGregor et al. | 439/76 |
| 5,208,732 | 5/1993 | Baudouin et al. | 361/684 X |
| 5,210,442 | 5/1993 | Ishimoto | 257/679 |
| 5,242,310 | 9/1993 | Leung | 439/76 |
| 5,244,840 | 9/1993 | Kodai et al. | 257/679 X |
| 5,285,559 | 2/1994 | Thompson et al. | 29/841 |
| 5,286,214 | 2/1994 | Takahashi | 439/159 |
| 5,397,857 | 3/1995 | Farquhar et al. | 174/52.1 |
| 5,414,597 | 5/1995 | Lindland et al. | 174/35 R X |

FOREIGN PATENT DOCUMENTS

| | | | |
|---|---|---|---|
| 5016582 | 1/1993 | Japan | 29/841 |
| 2076221 | 11/1981 | United Kingdom | 29/841 |

OTHER PUBLICATIONS

Granberry "How to Package and Interconnect with Microstrip" 1970 IEEE International Convention Digest, New York, S016000060 pp. 434–435.

*Primary Examiner*—Peter Vo
*Attorney, Agent, or Firm*—Schneck & McHugh

[57] ABSTRACT

A method of forming a module includes positioning a circuit card, such as a memory card, between separate frameworks and welding the frameworks together to encase the circuit card. The frameworks are preferably welded using sonic wave energy, thereby further enhancing the structural strength of the assembly. The assembly also includes cover and base panels. The panels are bent to further enhance the structural strength. In the preferred embodiment, the frameworks are injection molded onto the panels.

11 Claims, 3 Drawing Sheets

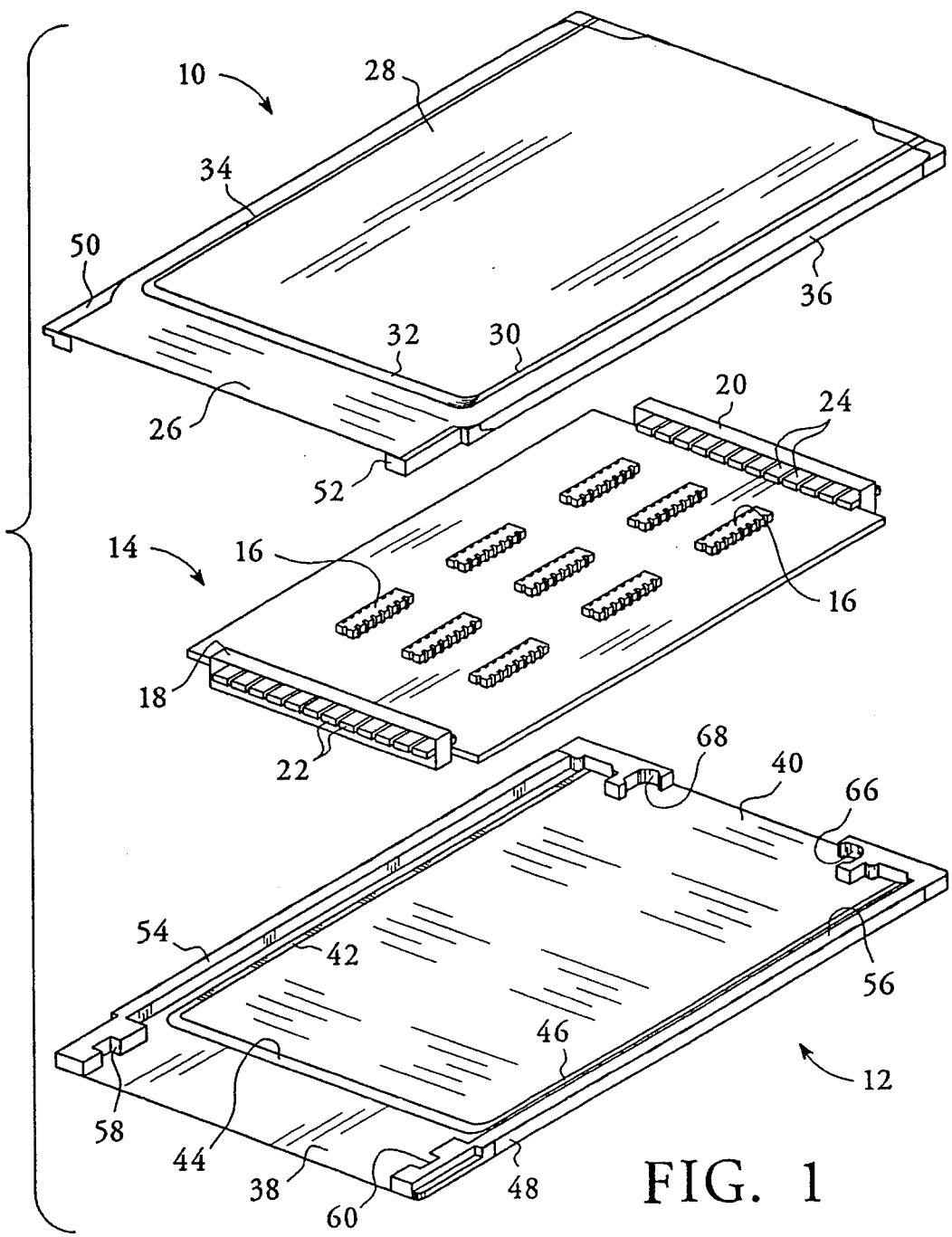
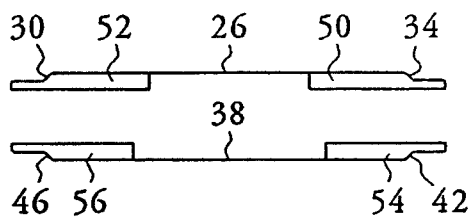
FIG. 2
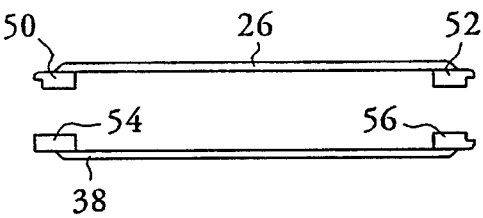
FIG. 3
FIG. 1 ns 5,502,892

METHOD OF FORMING A WELDED ENCASEMENT FOR A COMPUTER CARD

TECHNICAL FIELD

The present invention relates generally to printed circuit boards and more particularly to encasements for circuit boards to be selectively connected to an electronic device, such as a personal computer.

Background Art

One approach to meeting the increasing demand for memory in the use of computer systems is using memory cards which can be interchangeably connected to the system. The memory cards are each equipped with an identical connector which can be inserted into a connector of a computer or computer peripheral. Supply utilities and data are provided to the memory card via the connector. One standard for such a connector is the Personal Computer Memory Card International Association (PCMCIA), but other standards are known. In addition to memory cards, this approach has other uses. For example, portable facsimile modems may be carried on a card having a PCMCIA-compatible connector or the like.

Typically, circuit cards include integrated circuit chips that are interconnected by circuit traces. Encasements house the circuit cards. A standard for dimensions of such an encasement is 85 mm×54 mm, with a thickness of approximately 3.6 mm. U.S. Pat. No. 5,207,586 to MacGregor et al. describes a typical encasement. A frame formed of a polycarbonate includes ridges that receive the circuit card. The card is bonded to the ridges using an epoxy or other adhesive. Covers formed of sheet metal are then connected to the frame using tabs that fit into slots of the frame. The sheet metal covers provide structural support and provide protection of the electronic devices from electromagnetic interference.

A concern in the use of the encased circuit cards is that repeated handling will adversely affect the structural integrity of the assembly. The PCMCIA-compatible connector has sixty-eight contacts. The force necessary to seat and unseat the connector creates stresses that may cause deformation of the assembly. Continued use may result in electrical shorts or breakage.

U.S. Pat. No. 5,242,310 to Leung describes an input/output card in which the frame is formed of two parts that are secured together about a circuit board by glue or another bonding material. The two-part frame forms a structurally stronger assembly. However, because such assemblies typically have a fixed thickness, e.g. 3.6 mm, the increase in strength is limited.

An object of the present invention is to provide a module and a method of forming the module in which a circuit card, such as a memory board, is housed within an encasement that provides sufficient mechanical stability to allow repeated insertions and extractions of the module into an electronic device, such as a computer.

SUMMARY OF THE INVENTION

The above object has been met by using a multipart frame that is welded together to encase any circuit board. Preferably, the welding is performed using sonic wave energy, so that localized coalescence of frame parts is achieved without the need of a filler material. The absence of a bonding material or a filler material between the frame parts allows the frame itself to be formed to a maximum fixed thickness. Moreover, the module preferably is formed to include cover and base panels that are bent to extend along the thickness of the frame parts, so that the perpendicular portions of the panels further increase the mechanical strength of the module.

The base and cover panels are cut and bent as desired. While not critical, the length of the panel may be 85 mm and the width may be 54 mm. A first frame portion is injection molded along the opposed lengthwise edges of the cover panel. For applications in which a module is to include connectors at both widthwise edges, the first frame portion may be two separate pieces. Alternatively, the first frame portion may be a single-piece structure for applications in which a single connector is placed at only one of the two ends, allowing the frame portion to extend along the entirety of the opposite end.

A second frame portion is formed on the base panel in the same manner. In the preferred embodiment, the frame portions are injection molded onto the panels. The frame portions are made of a dielectric material, typically plastic material. The cover and base panels may be formed of a thin metal, so that the panels provide a shield against penetration of electromagnetic interference.

A circuit card is positioned between the first and second frame portions. The circuit card may be a memory card, a modem or facsimile card, or any of a variety of other cards used in such applications. A connector is located at one or both widthwise edges of the card. For example, a PCMCIA-compatible connector may be formed at one end and an edge connector may be provided at the opposite end.

Aligned first and second frame portions are subjected to a welding procedure. "Welding" is defined as localized coalescence of materials of the first and second frame portions. Electrosonic welding using ultrasonic wave energy is preferred.

An advantage of the present invention is that welding the frame portions together to form the fixed-thickness frame provides a structural integrity that can withstand stresses created during reasonable use of a printed card module. A circuit card is securely held between the frame portions, but the frame portions make direct contact. Because no filler material is used, the frame portions define the maximum thickness. Moreover, the bends in the panels increase the structural integrity.

BRIEF DESCRIPTION OF THE DRAWINGS

FIG. 1 Is an exploded perspective view of a circuit card module having first and second frame portions in accordance with the invention.

FIG. 2 is a rear view of the frame portions of FIG. 1.

FIG. 3 is a front view of the frame portions of FIG. 1.

BEST MODE FOR CARRYING OUT THE INVENTION

Figure 4:
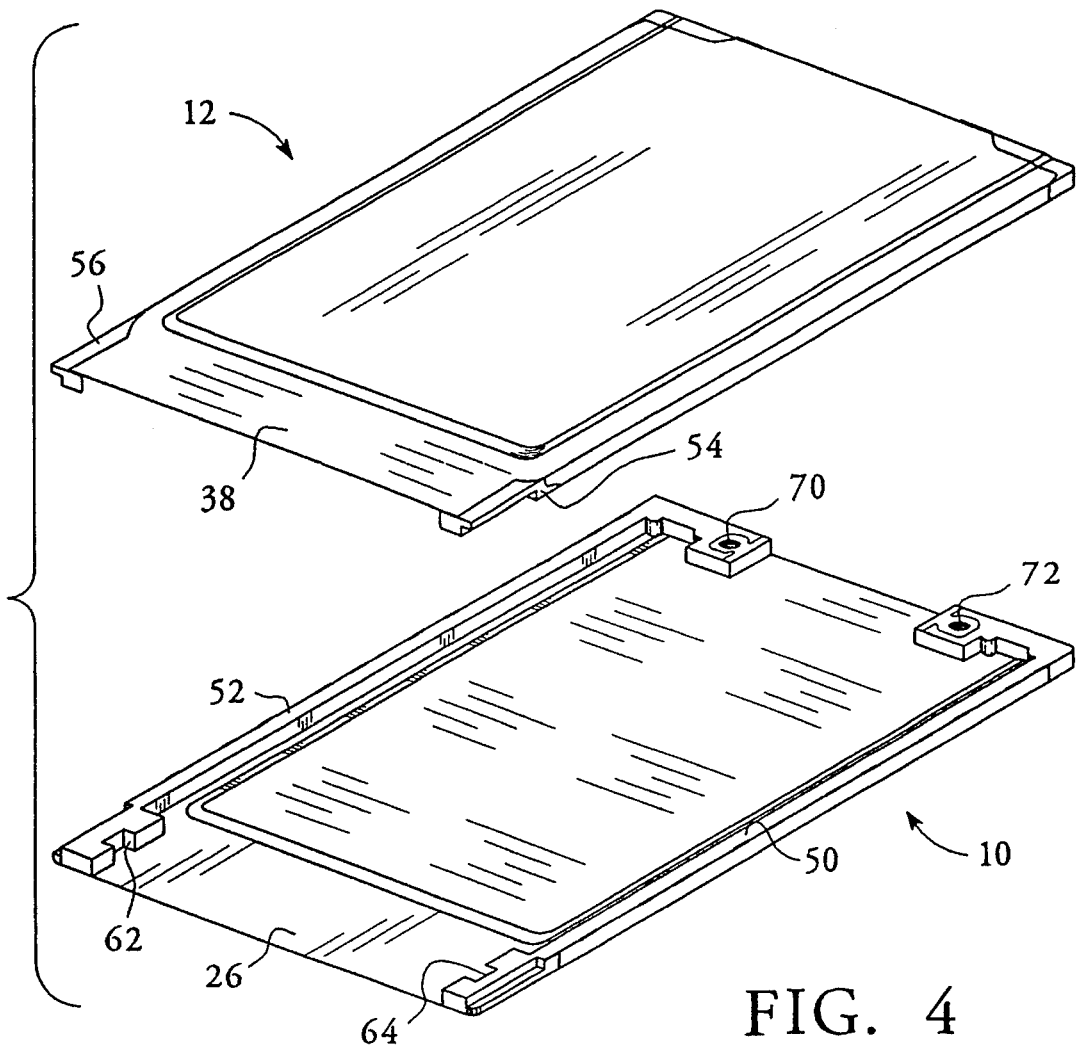
FIG. 4 is a perspective view of the module of FIG. 1 shown in an inverted position without a circuit card.

With reference to FIG. 1, a module is shown as having a first encasement section 10, a second encasement section 12, and a circuit card 14. The circuit card includes an array of integrated circuit chips 16. Printed circuit board traces, not shown, interconnect the integrated circuit chips and provide connection to a front connector 18 and a rear connector 20.

The front connector is shown as having an array of contacts 22. In practice, the front connector may be a PCMCIA-compatible connector. A Type I PCMCIA connector has sixty-eight pins arranged within a 3 mm slot. Type II and Type III PCMCIA connectors are known for larger applications.

The circuit card 14 may have any of a wide range of uses. PCMCIA is a standard for the credit card-sized memory and peripherals of a computer system. In addition to memory cards, modems, fax modems, wireless network connections and hard disk drives in the module of the type shown in FIG. 1 are known. Typically, a circuit card that is employed solely for memory purposes does not include a rear connector 20. However, a fax modem card will likely require an input/output connector. A series of contacts 24 is shown at the connector 20. The arrangement of contacts depends upon the type of card. Typically, the power and other utilities are supplied at the front connector 18, but the circuit card may include a battery.

The first encasement section 10 includes a metallic cover 26. In many applications, the assembled module is joined to a computer system in a vertical condition. Nevertheless, the metallic portion of the first encasement section is referred to as a "cover" for purposes of explanation.

The cover includes a raised region 28. While the raised region increases the thickness of the module, it has the advantages of providing additional clearance for the integrated circuit chips 16 and providing sloped surfaces 30, 32 and 34 that increase the structural stability of the first encasement section 10. Even more importantly, the lengthwise edges 36 of the metallic cover 26 are bent downwardly to form opposed edges that are perpendicular to the major surface of the cover. This significantly increases the ability of the cover to withstand forces that would otherwise deform the metal.

A metallic base panel 38 contains many of the features of the cover. The base panel includes a depressed region 40, sloped surfaces 42, 44 and 46 and upwardly bent edges 48 that are perpendicular to the major surface of the base panel. Again, it is the bending of the edges that provides a significant improvement in the structural strength of the encasement section 12.

Each of the first and second encasement sections 10 and 12 includes a frame portion consisting of first and second frame members 50, 52, 54 and 56. In a preferred embodiment, the frame members are formed of a dielectric material that allows the members to be injection molded directly to the associated cover or base panel 26 and 38. Thus, the edges 36 and 48 of the metallic cover and base panel form part of the mold for the injection molding procedure. While not shown in FIG. 1, the metallic edges 36 and 48 should have bends to partially cover the surfaces of the frame members that are opposite to the major surfaces of the cover and base panel., However, this overlap should be minimal, since proper assembly of the first encasement section 10 to the second encasement section 12 requires the surfaces of the frame members to be bonded together. The frame members 54 and 56 of the second encasement section 12 include ears 58 and 60 configured to receive the front connector 18 of the circuit card 14. Referring now to FIG. 4, the first and second encasement sections 10 and 12 are shown in an orientation opposite to that of FIG. 1. Thus, the cover 26 is shown below the base panel 38. The frame members 50 and 52 include ears 62 and 64 similar to those of the ears 58 and 60 shown in FIG. 1. The front connector 18 is captured within the four ears 58–64 to support the circuit card 14 in a position in which the metallic cover 26 and metallic base panel 38 will not electrically short the circuitry of the circuit card.

At the rear edges of the first and second encasement sections 10 and 12, the frame members 50–56 are configured to capture the rear connector 20. As previously noted, the type of connector will vary depending upon the specific application. In fact, a rear connector is not required in all applications.

As shown in FIG. 1, the frame members 54 and 56 associated with the base panel 38 are configured to include grooves 66 and 68 that capture the rear connector 20. In FIG. 4, the frame members 50 and 52 that are molded to the cover 26 have detents 70 and 72 adapted to capture tabs, not shown, of the rear connector.

The frame members 50–56 have been described as being injection molded. Alternatively, other molding procedures may be utilized. Moreover, the frame members may be formed separately from the cover 26 of the base panel 38 and then attached to the cover and base panel.

Figure 5:
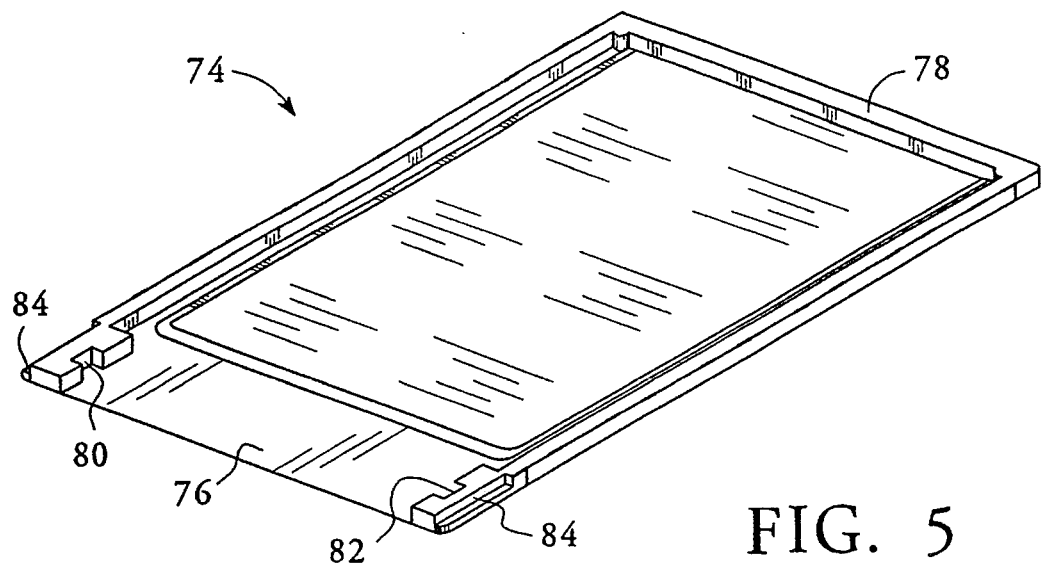
FIG. 5 is a second embodiment of a frame portion in accordance with the invention.

FIG. 5 shows an embodiment of an encasement section 74 for supporting a circuit board that does not include a rear connector. Typically, a memory card will not include a rear connector. The encasement section 74 has a metallic base panel 76 identical to the base panel of FIG. 1. However, the encasement section has a frame portion 78 that is a single piece, rather than the two-piece frame portions described above. The frame portion 78 extends across the entirety of the rear edge of the encasement section. At the forward end, ears 80 and 82 are shown for capturing a PCMCIA-compatible connector. Moreover, slots 84 are formed to accommodate a seating structure for plugging a fully assembled module into a connector of a computer system or the like.

Figure 6:
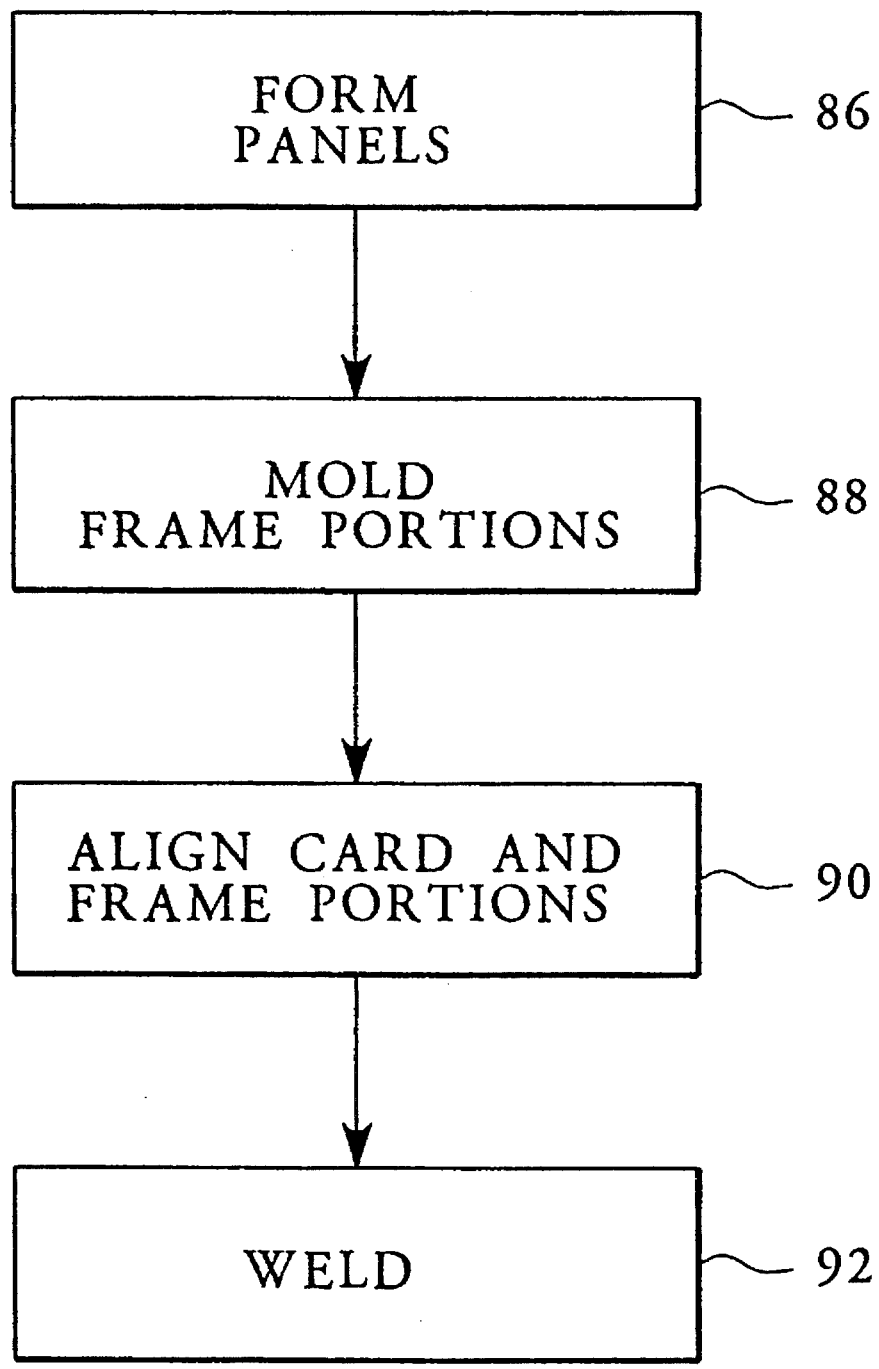
FIG. 6 is a flow chart of the steps for assembling the module of FIG. 1.

Referring now to FIG. 6, the preferred embodiment is one in which the cover and base panel are bent 86 into a desired shape and then used as a portion of the mold for forming the frame portions 88. Conventional injection molding techniques may be employed. Alternatively, the frame portions can be formed separately from the cover and base panel, using injection molding techniques or other known processes.

The circuit card and the frame portions are then aligned 90. The alignment is shown schematically in FIGS. 2 and 3. In FIG. 2, the base panel 38 includes the sloped surfaces 42 and 46. The molding of the frame members 54 and 56 to the back panel provides frame members having sloped regions that match the sloped surfaces of the base panel. However, the frame members cross the sloped surfaces 42 and 46 only at the rear surface of the back panel. As shown in FIG. 1, the frame members 54 and 56 consist primarily of parallel rails that are outside of the depressed region 40 of the base panel 38.

A similar construction is shown in FIG. 2 for the cover 26. The frame members 50 and 52 follow the configuration of the sloped surfaces 30 and 34 of the cover 26.

In FIG. 3, the cover 26 and the base panel 38 connect to the frame members 50–56. In the two end views of FIGS. 2 and 3, the cover and base panel do not extend along the side edges of the frame members. However, as noted above, the metallic cover and base panel preferably have vertical edges that increase the structural stability. Importantly, the facing surfaces of the frame members 50–56 remain exposed in order to allow the surfaces to be welded together.

Known techniques for welding the frame members 50–56 are utilized. Preferably, sonic wave energy is employed.

Electrosonic welding 92 achieves a coalescence of members using the combination of pressure and friction. The pressure is supplied by a jig into which the encasements and circuit card are fit. By forming a separate framework for the cover and the base panel, the structural strength of the module is enhanced. The welding of the two frameworks further enhances the structural strength. Consequently, the fully assembled module is capable of withstanding greater stresses as the module is repeatedly connected and disconnected from an electronic device during normal use.

I claim:

1. A method of forming a module to be selectively connected to an electronic device comprising:

forming a cover panel and a base panel;

molding a first frame portion onto said cover panel, including forming molded material along opposed lateral edges of said cover panel;

molding a second frame portion onto said base panel, including forming molded material along opposed lateral edges of said base panel;

positioning a printed circuit card between said first and second frame portions such that a connector extends at first ends of said first and second frame portions; and welding said first frame portion to said second frame portion;

said steps of forming said cover panel and molding said first frame portion including bending said base panel along said lateral edges thereof, thereby forming a bend of said base panel extending along the entire thickness of said first frame portion;

said steps of forming said base panel and molding said second frame portion including bending said base panel along said lateral edges thereof, thereby forming a bend of said base panel extending along the entire thickness of said second frame portion.

2. The method of claim 1 wherein molding said first frame portion includes forming first and second spaced apart members extending along said opposed lateral edges of said cover panel.

3. The method of claim 2 wherein molding said second frame portion includes forming third and fourth spaced apart members extending along said opposed lateral edges of said base panel.

4. The method of claim 1 wherein providing said cover and base panels is a step of providing planar metallic members.

5. The method of claim 1 wherein molding said first and second frame portions are steps of injection molding plastic onto metallic cover and base panels.

6. The method of claim 1 further comprising fixing said connector to said printed circuit card such that said connector is attachable to a Personal Computer Memory Card International Association (PCMCIA) port.

7. The method of claim 6 further comprising fixing an input/output connection means on an end of said printed circuit card opposite to said connector.

8. The method of claim 1 wherein positioning said printed circuit card is a step of positioning a memory card.

9. The method of claim 1 wherein welding said first frame portion to said second frame portion includes supplying sonic wave energy to vibrate said first and second frame portions.

10. A method of forming a module to be selectively connected to an electronic device comprising:

forming a first encasement section having a first metallic panel and a multiple-piece first plastic frame portion molded thereon, bending said first metallic panel along lateral edges thereof, thereby forming a bend extending along an entire thickness of said first plastic frame portion;

forming a second encasement section having a second metallic panel and a multiple-piece second plastic frame portion molded thereon, bending said second metallic panel along lateral edges thereof, thereby forming a bend extending along an entire thickness of said second plastic frame portion;

joining a PCMCIA-compatible connector to a circuit board;

joining a second connector to said circuit board on a side opposite to said PCMCIA-compatible connector;

trapping said circuit board between said first and second plastic frame portions such that said connectors are accessible through openings between said first and second frame portions; and welding said first and second plastic frame portions using sonic wave energy.

11. The method of claim 10 wherein forming said first and second encasement sections each including injection molding said frame portions to said metallic panels.

* * * * *